United States Patent
Tobin

(10) Patent No.: US 11,621,554 B2
(45) Date of Patent: Apr. 4, 2023

(54) FAULT PROTECTION CONFIGURATION FOR A RESETTABLE TRANSFORMER PROTECTOR

(71) Applicant: S&C Electric Company, Chicago, IL (US)

(72) Inventor: Thomas J Tobin, Northbrook, IL (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 16/776,703

(22) Filed: Jan. 30, 2020

(65) Prior Publication Data

US 2020/0251895 A1   Aug. 6, 2020

Related U.S. Application Data

(60) Provisional application No. 62/800,739, filed on Feb. 4, 2019.

(51) Int. Cl.
| | | |
|---|---|---|
| *H02H 7/04* | (2006.01) | |
| *H02H 7/26* | (2006.01) | |
| *G01R 31/08* | (2020.01) | |
| *G01R 19/165* | (2006.01) | |
| *H02H 1/04* | (2006.01) | |
| *H02H 1/06* | (2006.01) | |
| *H02H 3/00* | (2006.01) | |
| *H02H 3/08* | (2006.01) | |
| *H02H 3/093* | (2006.01) | |

(52) U.S. Cl.
CPC .......... *H02H 7/261* (2013.01); *G01R 31/085* (2013.01); *H02H 1/04* (2013.01); *H02H 3/006* (2013.01); *H02H 3/08* (2013.01)

(58) Field of Classification Search
CPC ............ H02H 7/04; H02H 7/261; H02H 1/04; H02H 3/006; H02H 3/08; H02H 1/063; H02H 3/06; H02H 3/0935; G01R 31/085; G01R 19/16538
See application file for complete search history.

(56) References Cited

U.S. PATENT DOCUMENTS

| | | | |
|---|---|---|---|
| 3,604,983 A | 9/1971 | Levin et al. | |
| 4,672,501 A | 6/1987 | Bilac et al. | |
| 4,752,859 A * | 6/1988 | Chabala ................ | H01H 33/02 200/48 R |
| 5,784,233 A | 7/1998 | Bastard et al. | |
| 10,418,804 B2 * | 9/2019 | Staszesky .............. | H02H 7/261 |
| 2006/0291120 A1 * | 12/2006 | Guzman-Casillas .... | H02H 3/08 361/93.1 |

(Continued)

FOREIGN PATENT DOCUMENTS

EP   0596643 A1   5/1994

OTHER PUBLICATIONS

S&C Trans-Rupter II Transformer Protector, S&C Electric Company, November (Year: 2004).*

(Continued)

*Primary Examiner* — Sisay G Tiku

(57) ABSTRACT

Described are curve shapes that may be implemented in a transformer protector that provide enhanced fault protection. A transformer protector curve rating structure relates response curves to the transformer size and simplifies selection of response curves implemented within a transformer protector and associated transformer.

5 Claims, 3 Drawing Sheets

(56) References Cited

U.S. PATENT DOCUMENTS

| | | | |
|---|---|---|---|
| 2010/0195763 A1* | 8/2010 | Lee | H02H 1/0061 375/295 |
| 2012/0134061 A1* | 5/2012 | Kasztenny | H02H 1/0061 361/64 |
| 2014/0100702 A1* | 4/2014 | Schweitzer, III | H02J 13/00028 700/286 |
| 2018/0323611 A1* | 11/2018 | Gubba Ravikumar | G05B 17/02 |
| 2019/0103762 A1* | 4/2019 | Dolezilek | H02J 3/381 |
| 2020/0350761 A1* | 11/2020 | Wang | H02J 13/00006 |

OTHER PUBLICATIONS

International Search Report and Written Opinion for International Application No. PCT/US2020/015785 dated Apr. 20, 2020. (7 pages).

S&C Trans-Rupter II® Transformer Protector; Manual; S&C Electric Company; Nov. 1, 2004; <URL https://www.sandc.com/globalassets/sac-electric/documents/sharepoint/documents—all-documents/descriptive-bulletin-731-30.pdf?dt=637211992186817559>; 7 pages.

European Search Report for European Application No. 20752415.8 dated Sep. 12, 2022 . (9 pages).

Dudor, J. S et al; "Problems and solutions for protective relay applications in petroleum facilities—some protection applications for generators and transformers"; Petroleum and Chemical Industry Conference, 1995. Record of conference papers , Industry Applications Society 42nd Annual Denver, CO, USA; Sep. 11, 1995; pp. 131-144 (14 pages); ISBN: 978-0-7803-2909-6.

* cited by examiner

FAULT PROTECTION CONFIGURATION FOR A RESETTABLE TRANSFORMER PROTECTOR

CROSS-REFERENCE TO RELATED APPLICATION

This application claims the benefit of priority from the U.S. Provisional Application No. 62/800,739, filed on Feb. 4, 2019, the disclosure of which is hereby expressly incorporated herein by reference for all purposes.

BACKGROUND

Field

This disclosure relates generally to resettable transformer protection devices, and in particular, this disclosure relates to device characteristics providing fault protection in a transformer protection device.

Discussion of the Related Art

An electrical power distribution network, often referred to as an electrical grid, typically includes a number of power generation plants each having a number of power generators, such as gas turbines, nuclear reactors, coal-fired generators, hydro-electric dams, renewable plants (wind and solar), etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeder lines. The feeder lines are coupled to a number of lateral lines that provide the medium voltage to various distribution transformers, where the voltage is stepped down to a low voltage and is provided to a number of loads, such as homes, businesses, etc. Power distribution networks of the type referred to above typically include a number of switching devices, breakers, reclosers, interrupters, etc. that control the flow of power throughout the network and respond to abnormalities in the power flow.

A new class of distribution transformer protection is possible because of evolving electronic and fault interrupter technology which allows for a small, compact protective device that can offer improved (faster) fault detection and interruption. The VacuFuse™ transformer protector, available from S&C Electric Company, Chicago Ill., USA, is a device that exemplifies this increased functionality.

Protection for distribution transformers typically has been provided by fuse with classic inverse time-current characteristics. Because of the thermal response of the fusable elements having 2:1 time-current response at high currents, the fuses had to be sized to withstand both the continuous current loading or overloading and the magnetizing inrush current. This then pushed the fuse to a slower response for faults that can occur between the fuse and the transformer winding. These faults can occur on the wiring or on the transformer bushing external to the transformer tank, or on the internal wiring within the transformer but before the winding. These fault currents are high current—that is, the magnitude of the fault current is the available fault current on the power system. These fault currents can be from 500 amps (A) up to the 6, 8 or 10 kA. A slower response and clearing of these faults can cause severe voltage sags, force larger upstream protection settings for coordination reasons, result in transformer damage from arcing to the transformer tank, and increased pressure rise from arcing faults under the oil within the transformer tank.

From an application perspective, making the selection of the protection curves in the new device "easy" suggests that the protection curves mimic the existing fuse curves. But this brings along the same slower clearing of the high current faults since the fuse size had to be sufficient to avoid the magnetizing inrush and also carry the overload. A new curve rating structure and a new curve shape to make the selection of the protection response simple and clearly related to the transformer size while providing fast high current clearing is needed.

SUMMARY

The following discussion discloses and describes curve shapes that may be implemented in a transformer protector that provide enhanced fault protection.

Additionally, a transformer protector curve rating structure clearly relates response curves to the transformer size and simplifies selection of response curves implemented within a transformer protector and associated transformer.

Additional features of the disclosure will become apparent from the following description and appended claims, taken in conjunction with the accompanying drawings.

DETAILED DESCRIPTION

The following discussion of the embodiments of the disclosure directed to a transformer protector, and in particular, a transformer protector configured to include multiple response curves providing enhanced protection characteristics.

Figure 1:
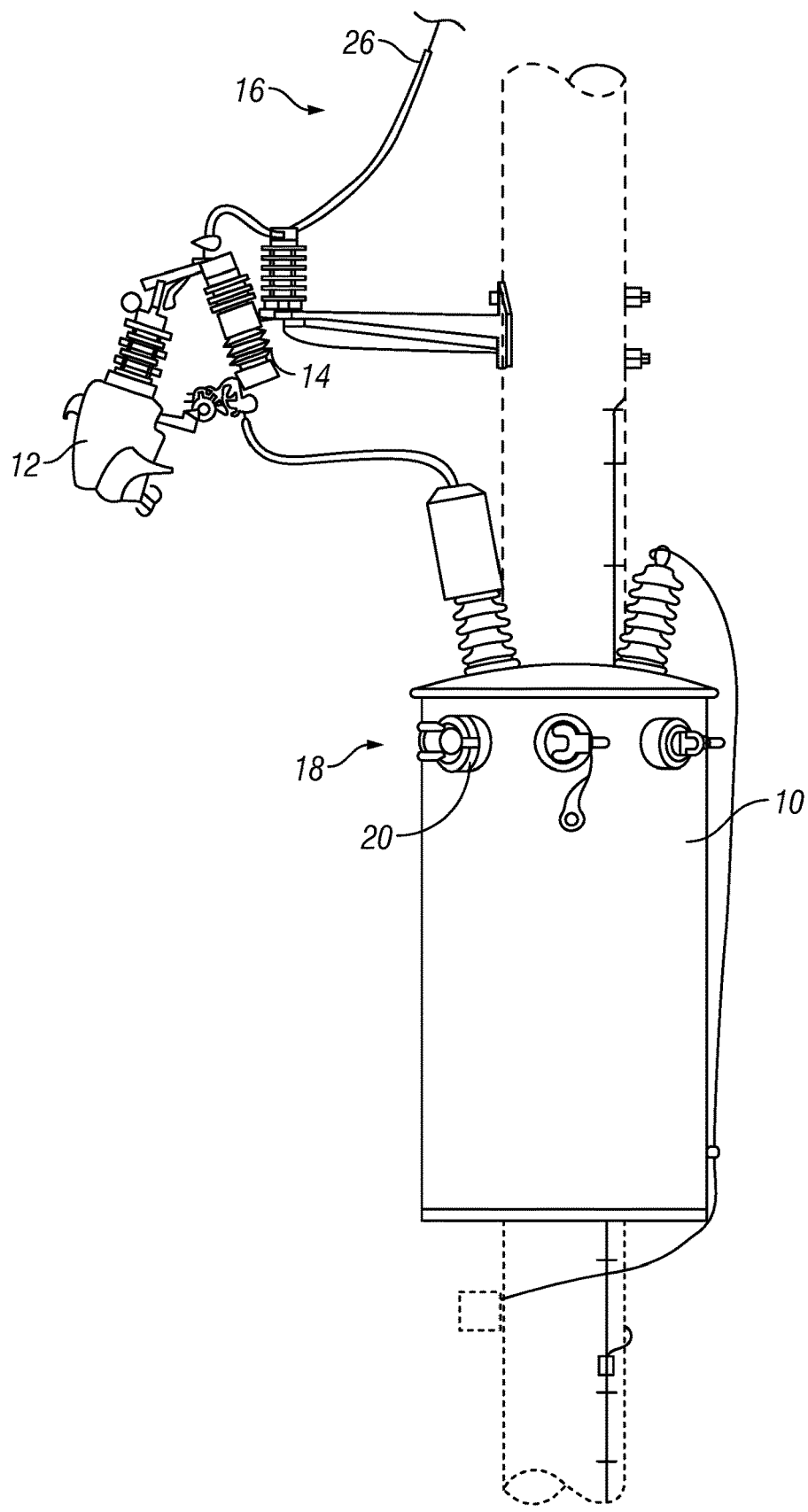
FIG. 1 is a graphic depiction of a transformer protector and associated transformer in accordance with herein described embodiments.

FIG. 1 depicts an overhead distribution transformer 10 and a transformer protector 12 fitted within a mounting 14. Ancillary wiring, insulators, bushings and guards are depicted but for the sake of clarity are not separately identified. The distribution transformer 10 and transformer protector 12 are operably configured between a primary distribution side 16 of the electric grid at a first voltage and a secondary side 18 of the electric grid at a second voltage. The first voltage is typically at medium distribution voltage, and the second voltage is typically at low voltage both as understood by the person having ordinary skill in the art and which will vary based upon the power system configuration. The transformer 10 is configured in this arrangement to transform the electric power from medium voltage on the primary side to low voltage on the secondary side. In this regard, the distribution transformer 10 receives medium voltage electric power on the primary side 16 via the transformer protector 12 and provides output low voltage electric power on the secondary side 18 at one of several available taps 20. The configuration of the distribution transformer 10 is typical, and therefore additional discussion of its structure and function is omitted for brevity.

Figure 2:
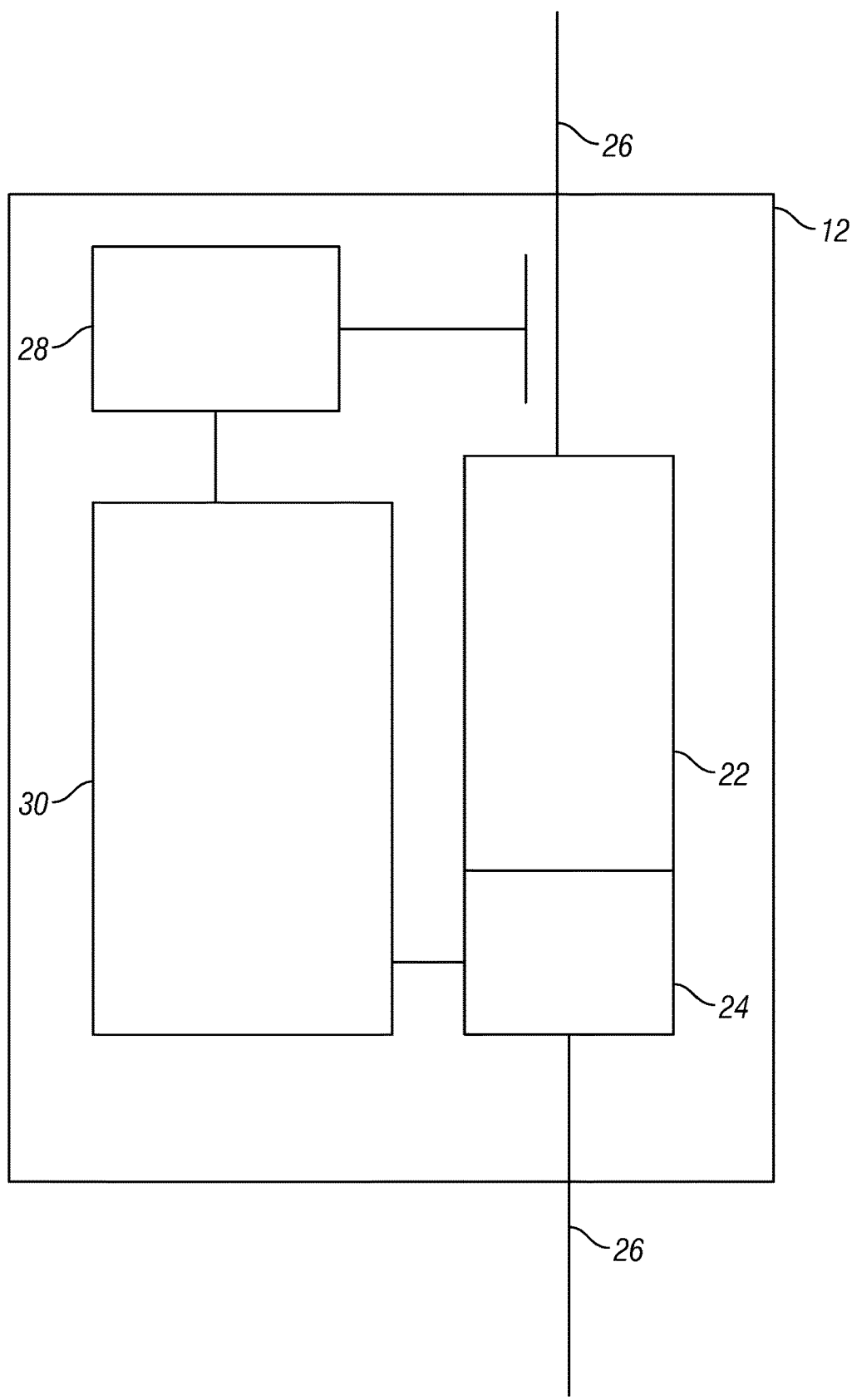
FIG. 2 is a block diagram of a transformer protector in accordance with the herein described embodiments.

FIG. 2 depicts the functional aspects of the transformer protector 12. A fault interrupting device 22 and associate operating mechanism 24 is coupled in series with to the primary side 16 electrical conductor 26. The fault interrupting device 22 may be a vacuum interrupter or other suitable device capable of interrupting a current fault on the primary side within the rating of the transformer protector 12. A current sensor 28 is operably disposed in relation to the electrical conductor 26 to sense the magnitude of current flow in the conductor 28 and to provide a corresponding signal to a controller 30. The current sensor 28 may also be configured to harvest electric power from the conductor 26 to power the controller 30 and the operating mechanism 24. The controller 30 is coupled to the current sensor 28 to receive the signal and has an output coupled to the operating mechanism 24 to operate the fault interrupting device 22 in accordance with a protection strategy.

The controller 30 includes (not depicted) an application specific processing device or general purpose processor coupled with a memory containing operating instructions upon which the processor acts to affect operation of the transformer protector 12. In this regard, the processor is operable responsive to receipt of the signal from the current sensor 28 to determine the presence of a fault condition, e.g., current in excess of a threshold value for a predetermined period of time, and to cause operation of the fault interrupting device to interrupt the flow of current into the transformer 10. The fault interrupting device may be configured to be resettable, in an automated manner or responsive to a signal from the controller 30, to close the fault interrupter after one or more interruptions to restore current flow to the transformer 10. This allows the transformer protector to restore electric service should the fault be transitory. Under certain conditions, the fault interrupter may be held open or "locked out" to prevent coupling of current to the transformer 10 until an investigation of the cause of the fault may be determined and rectified, and/or the condition of the transformer assessed.

Figure 3:
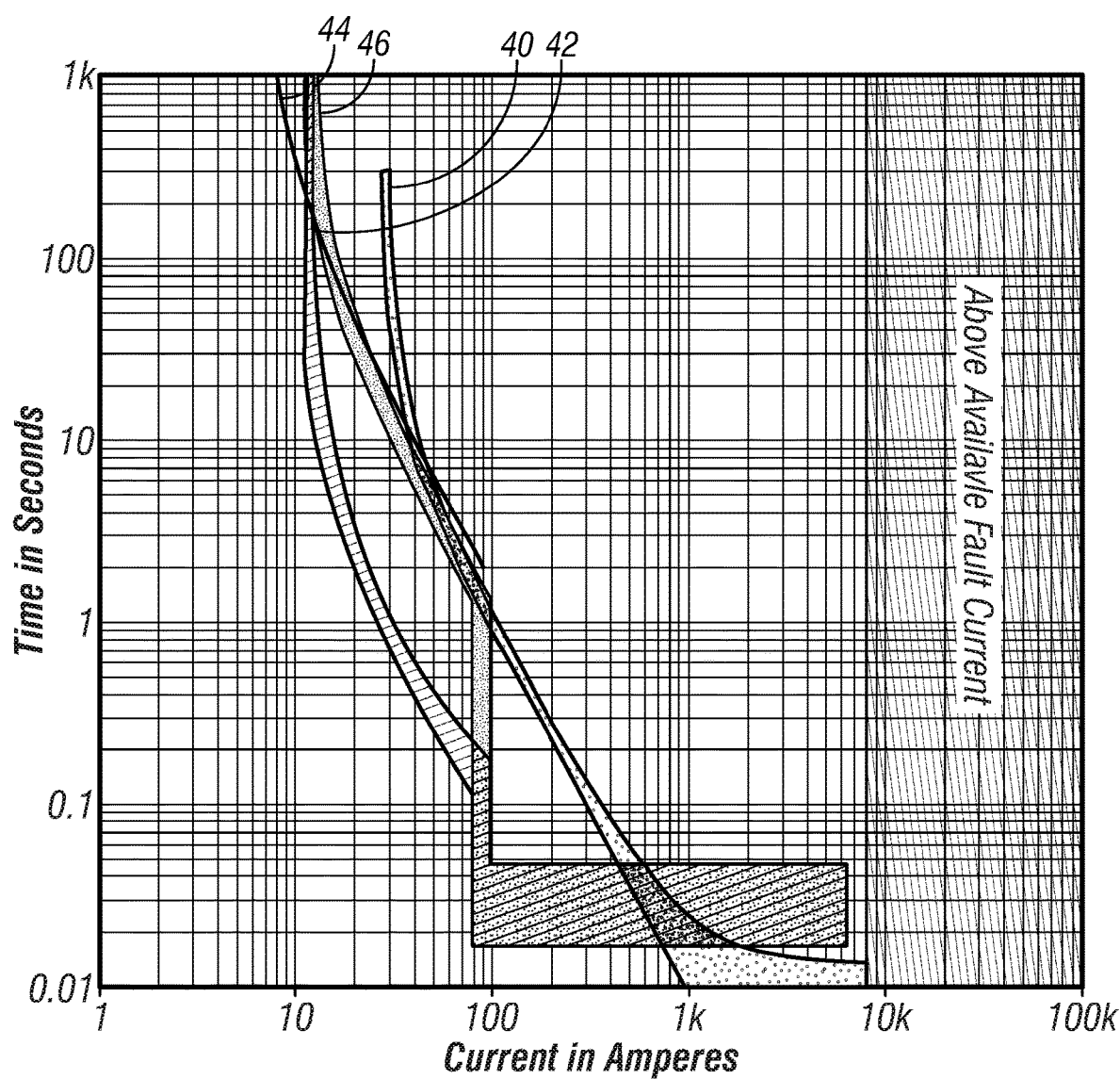
FIG. 3 is a graphic depiction of possible response curves that may be implemented within a transformer protector in accordance of the herein described embodiments.

In accordance with the herein described embodiments and with reference to FIG. 3, the controller 30 may be provided with at least one and preferably several response curves responsive to which the controller 30 causes operation of the fault interrupting device 22 to interrupt current flow. The curves are typically referred to as time-current-characteristic (TCC) curves. The curve 40 is an exemplary "T" speed fuse link that is capable of carrying the cold load pickup current. Once selected, it defines the remaining fuse shape. A fuse configured with this curve responds "instantaneously" for fault current above 1 kA.

The curve 42 is exemplary of a fuse curve defined in accordance with the herein described embodiments. It has a pickup current of 11-12 A, and an instantaneous response at 88 A vastly speeding up the response for currents from 88 A up to 1000 A. The curve 42 is a very inverse C3 curve which has a response similar to the T speed link in the intermediate current range.

The curve 44 is an alternate curve in accordance with the herein described embodiments with the same pickup and instantaneous response but with a faster response in the intermediate range (U4 extremely inverse) and this provides faster response for the secondary fault current below 88 A.

The curve 46 is the transformer damage curve based on the transformer withstand for secondary faults. The classic T speed fuse link only provides protection for faults above 50 A or about 60% or more of the available secondary fault current. The curve 46 from this disclosure provides protection for a wider range of secondary fault currents but is operating at the limit of the damage curve.

The curve 44 appears to provide better protection curve over the entire secondary fault current range in comparison to the curves 40, 42 or 46.

A simple approach, therefore, to curve selection, is to create a protection curve that is rated based on the transformer size at a give voltage. For example, a protection curve "25 kVA-15 kV" meaning a curve for a 25 kVA transformer at 15 kV system voltage. The curve will have specific settings:

1. A minimum long term response that is 3 times the full load current rating of the transformer. For this transformer, the full load current 3.5 A and the minimum response current would be 11 A (round number setting)
2. A inverse time current setting that mimics the T speed fuse link response
3. A instantaneous response characteristic for all currents that are 25 times the full load current or 88 A.

Selection of curves in accordance with this strategy would provide the fastest protection for any high current faults on the primary side of the transformer while not falsely operating on magnetizing inrush or cold load inrush up to 1.5 times the rating of the transformer. It is noted that these numbers and curves 42-46 are exemplary. In accordance with the herein described embodiments a simplified protection rating for a transformer protector 30 uses the transformer kVA rating and a specific curve with both an inverse curve and instantaneous response setting that provides the closest protection based on a fixed ratio to the transformer full load current. The fixed ratio number may be refined in view of an overall protection strategy, or the inverse characteristic may be refined from the classic fuse curve to define the optimum protection under specific application rules.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An electric power distribution system having a transformer disposed between a primary distribution side at a first voltage and a secondary distribution side at a second voltage, the transformer being configured to transform the first voltage from the first voltage on the primary side to the second voltage on the secondary side, the system comprising:
   a transformer protector disposed between the primary distribution conductor and the transformer, the transformer protector having a housing containing operatively coupled a current sensor, a controller and a fault interrupter, wherein
   the current sensor is operably coupled to the primary conductor to provide to the controller a primary conductor current signal corresponding to a primary side conductor current, and
   wherein the controller is configurable with a first fault interrupting response, a second fault interrupting response, and a third fault interrupting response, responsive to which the controller is operable to affect operation of the fault interrupter to interrupt current flow through the transformer; wherein
   the first fault interrupting response has a pickup response at a pickup current level and an instantaneous response above a threshold fault current level, the second fault interrupting response has the pickup response and the instantaneous response and a second intermediate response at an intermediate current level between the pickup current level and the instantaneous current level, wherein the second intermediate response is faster in time than a first intermediate response in time of the first fault interrupting response, and the third fault interrupting response corresponds to a transformer damage prevention response.

2. The electric power distribution system of claim 1, wherein the second intermediate response is optimized for a range of transformer secondary side current faults.

3. The electric power distribution system of claim 1, wherein instantaneous response current level is a multiple of a full load current rating of the transformer.

4. The electric power distribution system of claim 1, wherein the second fault interrupting response comprises a long-term response current level, wherein the long-term response current level is a multiple of a full load current rating of the transformer.

5. The electric power distribution system of claim 1, wherein a portion of the second intermediate response mimics a portion of the transformer damage prevention response.

* * * * *